United States Patent
Schilling et al.

(10) Patent No.: US 7,518,372 B2
(45) Date of Patent: Apr. 14, 2009

(54) MRI RF COIL ARRANGEMENT WITH SOLDER JOINT REINFORCEMENT OF DISCRETE COMPONENTS

(76) Inventors: Harry Schilling, Klostergarten 15a, D-85072 Eichstaett (DE); Patrick Gross, Kaiserstrasse 30, D-80801 Muenchen (DE)

( * ) Notice: Subject to any disclaimer, the term of this patent is extended or adjusted under 35 U.S.C. 154(b) by 0 days.

(21) Appl. No.: 11/334,856

(22) Filed: Jan. 19, 2006

(65) Prior Publication Data

US 2007/0001676 A1 Jan. 4, 2007

(30) Foreign Application Priority Data

Jun. 29, 2005 (DE) .................. 10 2005 030 745

(51) Int. Cl.
*G01V 3/00* (2006.01)
(52) U.S. Cl. ..................... 324/322; 324/318
(58) Field of Classification Search ......... 324/318–322; 600/407–435; 333/219–235
See application file for complete search history.

(56) References Cited

U.S. PATENT DOCUMENTS

| | | | |
|---|---|---|---|
| 4,613,837 A * | 9/1986 | Blass et al. ............... 333/219 |
| 4,636,730 A | 1/1987 | Bottomley | |
| 4,887,039 A | 12/1989 | Roemer et al. | |
| 5,990,681 A | 11/1999 | Richard et al. | |
| 6,215,307 B1 * | 4/2001 | Sementchenko ........... 324/318 |
| 6,735,851 B2 * | 5/2004 | Romo et al. .............. 29/606 |
| 7,030,610 B2 * | 4/2006 | Mansfield ................. 324/318 |
| 7,088,104 B2 * | 8/2006 | Bottomley ................ 324/328 |
| 7,106,061 B2 * | 9/2006 | Zeiger et al. ............. 324/318 |
| 7,151,374 B2 * | 12/2006 | Doty .................... 324/321 |
| 7,352,185 B1 * | 4/2008 | Zens et al. ............... 324/322 |
| 2002/0067167 A1 * | 6/2002 | Romo et al. .............. 324/318 |
| 2003/0155174 A1 * | 8/2003 | Mansfield ................. 181/207 |
| 2005/0062472 A1 * | 3/2005 | Bottomley ................ 324/317 |
| 2005/0168223 A1 * | 8/2005 | Zeiger et al. ............. 324/322 |
| 2007/0001676 A1 * | 1/2007 | Schilling et al. .......... 324/322 |

FOREIGN PATENT DOCUMENTS

| | | |
|---|---|---|
| DE | 10124449 | 11/2002 |
| EP | 0384061 | 2/1995 |
| EP | 0568225 | 9/1997 |
| EP | 1255119 | 5/2004 |
| FR | 2557298 | 6/1985 |
| WO | 99/15914 | 4/1999 |

\* cited by examiner

*Primary Examiner*—Brij B. Shrivastav
*Assistant Examiner*—Tiffany A Fetzner
(74) *Attorney, Agent, or Firm*—Kevin L. Daffer; Daffer McDaniel, LLP

(57) ABSTRACT

A transmitting or receiving coil assembly for nuclear spin tomographs comprises a multi-layer structure of conducting layers forming inductive components on an insulating support layer. Discrete components such as capacitors are accommodated in recesses of the support layer. Reinforcement members make it possible to increase the mechanical stability of the arrangement.

14 Claims, 4 Drawing Sheets

MRI RF COIL ARRANGEMENT WITH SOLDER JOINT REINFORCEMENT OF DISCRETE COMPONENTS

PRIORITY CLAIM

The present application claims priority to German Application No. 102005030745.0 filed Jun. 29, 2005.

BACKGROUND OF THE INVENTION

1. Field of the Invention

The invention relates to nuclear spin tomography and, in particular, to medical instruments for examining human and animal bodies. Nuclear spin tomography is also known as magnetic resonance tomography, MRT for short.

MRT is an image-generating method based on the physical phenomenon of nuclear spin resonance. An object to be examined is subjected to a strong magnetic field. This causes an alignment of previously statistically distributed nuclear spins of the individual atoms. Excitement with high-frequency energy from outside causes measurable vibrations. In order now to render possible a spatial localization, magnetic fields which are inhomogeneous along the three spatial axes are generated using gradient coils in the magnetic field. Transmitting coils are provided for emitting the high-frequency excitation energy. A reception of excited oscillations is effected with receiving coils. Transmitting coils and receiving coils are frequently combined with each other. In the following, these coils are also referred to as HF coils, because they serve for coupling-in or coupling-out high-frequency signals.

This non-invasive image-generating method makes it possible to obtain images of sections through a human or animal body along any desired axes.

2. Description of the Prior Art

Examples of transmitting and receiving coils are disclosed in U.S. Pat. No. 4,887,039. There a plurality of parallel conductors which are connected to each other via coupling capacitors are mounted on a cylindrical support. Feeding is effected by means of symmetrical conductors or coaxial cables. So-called phased-array arrangements, as shown in FIG. 4 of this Patent Specification, are employed in order to achieve higher resolutions. For this, a plurality of independent coils having independent receiver inputs are connected for separate evaluation of the signals.

The construction of coils of this kind is very complex, and the manufacturing costs are therefore relatively high. In coil arrangements of the future, an increasing number of coils will have to be provided, whilst the higher resolution will cause even greater demands to be made on the mechanical tolerances.

BRIEF SUMMARY OF THE INVENTION

It is the object of the invention to introduce a coil arrangement that makes it possible to simplify the mechanical construction and therewith reduce the manufacturing costs, whilst maintaining or improving the electrical properties. At the same time, mechanical tolerances are to be further reduced.

In accordance with the invention this object is achieved by an HF coil arrangement for nuclear spin tomographs, comprising: at least one support layer of insulating material having at least one recess for accommodating at least one discrete component; and electrical conductors mounted on the at least one support layer of insulating material to form one or a plurality of inductive components.

BRIEF DESCRIPTION OF THE DRAWINGS

In the following the invention will be described by way of example on embodiments with reference to the drawings, without limitation of the general inventive concept.

DETAILED DESCRIPTION OF THE INVENTION

Figure 1:
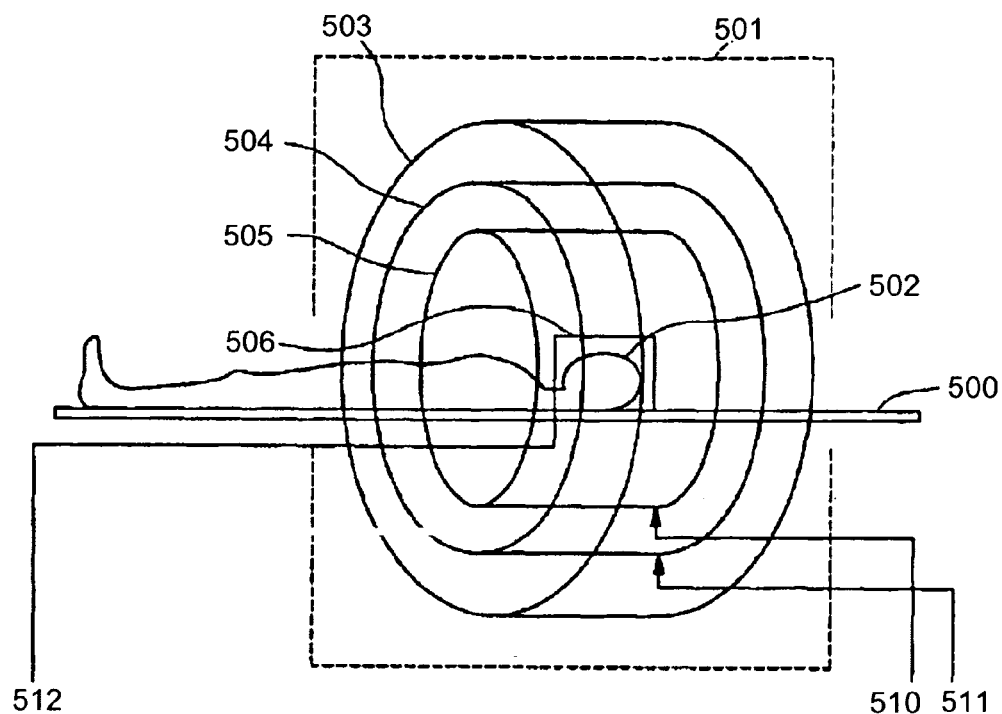
FIG. 1 schematically shows in a general form a device for nuclear spin tomography.

FIG. 1 schematically shows in a general form a device for nuclear spin tomography. A patient 502 lies on a berth 500 in a magnet system 501. Animals or any desired objects also may be examined instead of a patient. A main magnet 503 serves to generate a static main magnetic field. For determination of location, temporally and spatially variable magnetic fields are generated by means of gradient coils 504. These are controlled by gradient signals 511. A high-frequency field for exciting nuclear spin resonances is fed into an object to be examined with the aid of a transmitted signal 510 through transmitting coils 505. Detection of measurement signals 512 is effected by means of receiving coils 506. Optionally, the transmitting coils and the receiving coils may be spatially combined with each other. Similarly, the same coil arrangement may first be used for signal emission and later for signal reception. The receiving coils 506 may also be disposed in an outer region of the transmitting coils 505. Similarly, the transmitting coils 505 also may be disposed in the vicinity of the object to be examined, in the same way as the receiving coils 506 shown here.

Figure 2:
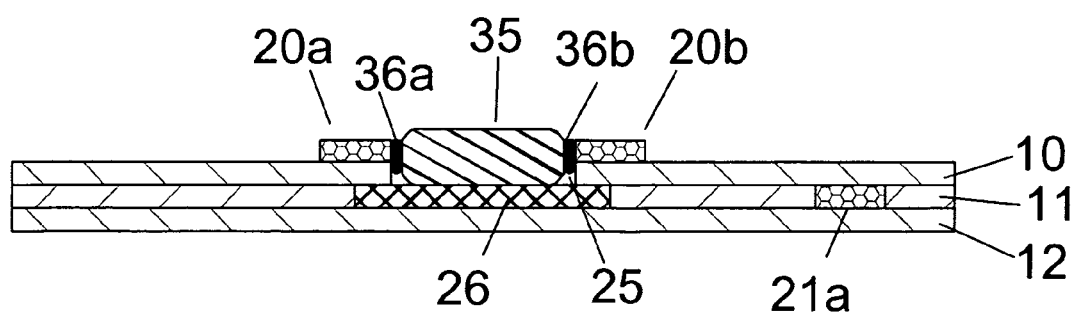
FIG. 2 shows a sectional view of a coil arrangement according to the invention.

FIG. 2 shows a sectional view of a coil arrangement in accordance with the invention. A first coil with conductors 20a and 20b is formed in a first conductor layer. This conductor layer is laminated onto a first insulator layer 10. Another conductor layer for forming a second coil with a conductor 21a is provided on the other side of the first insulator layer 10. Of course, as many conductors as desired may be formed in the conductor layers. Finally, a second insulator layer 12 is provided below the second conductor layer. In this manner almost as many conductor layers and insulator layers as desired may be combined with each other. By a pressing operation during fabrication, the hollow spaces between the insulator layers are also filled with insulator material from the layers located above or below which become deformed. Similarly, however, the hollow spaces can be filled also with an own layer of insulating material. A recess 25 is provided in the first insulator layer 10, into which a discrete component 35, here for example an SMD capacitor, is inserted. This component is connected to the adjacent conductors 20a and 20b via two soldered joints 36a and 36b. In order to compensate a weakening of the arrangement, caused by the recess, and to keep any tensional forces arising from thermal expansion, or also bending loads, away from the component 35 and the soldered joints 36, a reinforcement member 26 is embedded in the arrangement.

Figure 3:
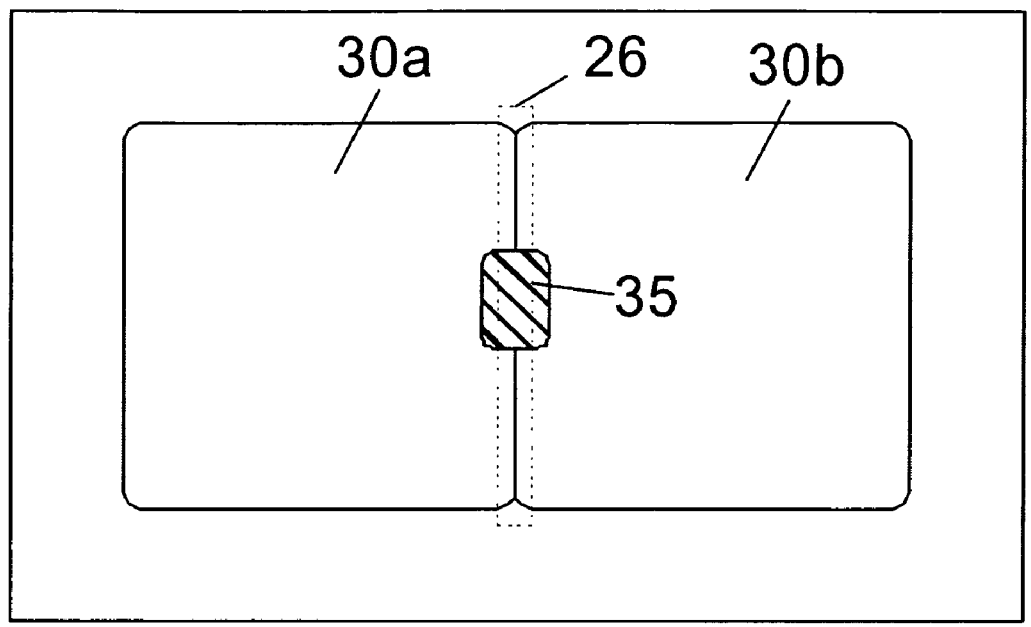
FIG. 3 shows a plan view of a coil arrangement according to the invention.

FIG. 3 shows a plan view of a coil arrangement according to the invention. A first coil 30a and also a second coil 30b are connected to a discrete capacitor 35. A reinforcement member 26 is provided to increase the rigidity.

Figure 4:
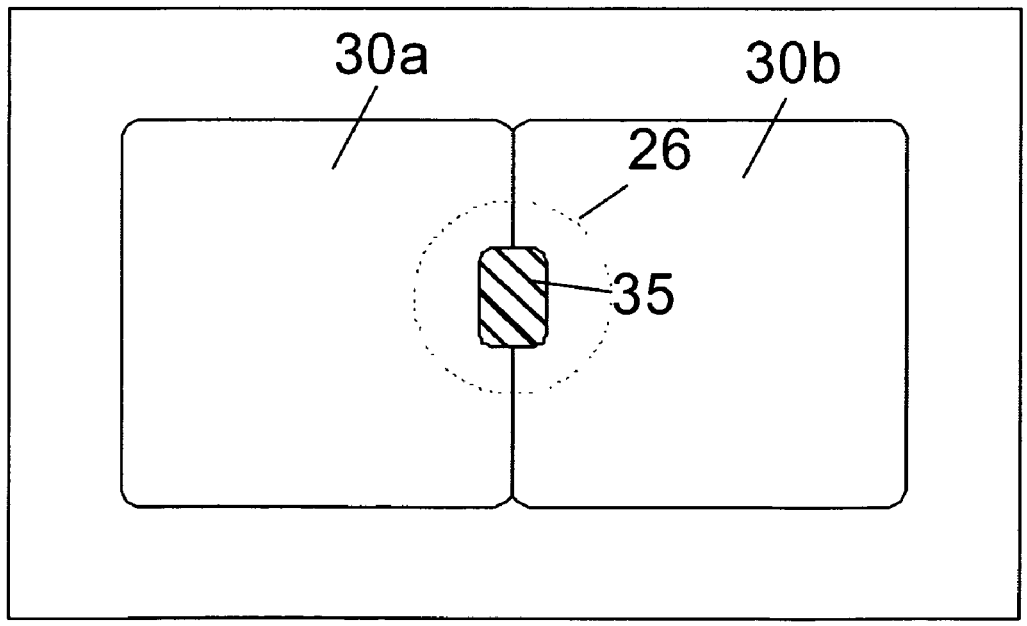
FIG. 4 shows a plan view of a special embodiment of a reinforcement member.

FIG. 4 illustrates a specially advantageous kind of reinforcement member. This reinforcement member is shaped to be elliptical, preferably circular. This results in a uniform distribution of force, and a danger of tension cracks is further reduced.

Figure 5:
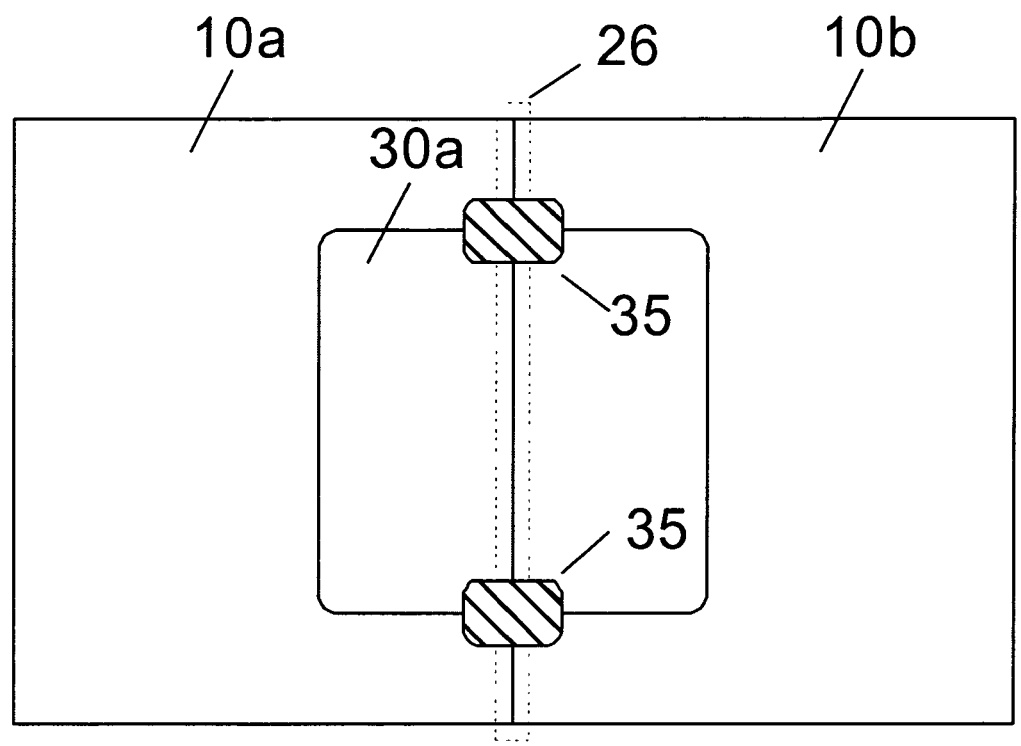
FIG. 5 shows a plan view of another embodiment in which a reinforcement member simultaneously serves as a mechanical connection of a plurality of supports.

FIG. 5 shows another advantageous embodiment of the reinforcement member. This reinforcement member simultaneously serves to connect two support plates or layers of insulating material 10a, 10b. Of course, the reinforcement member 26 may be just as long as the layers of insulating material, or just as short. Here a projecting length of the reinforcement member has been drawn only for reasons of clarity of demonstration.

Figure 6:
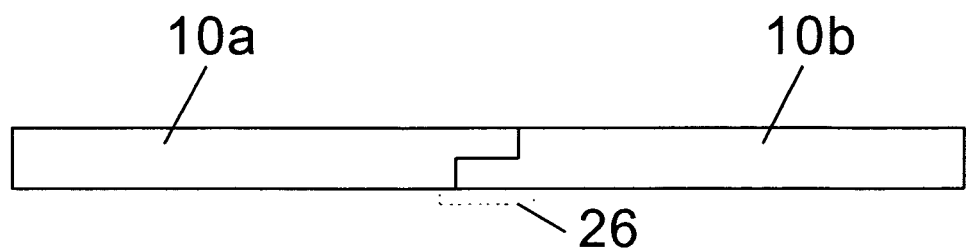
FIG. 6 shows a sectional view of an embodiment with an overlapping arrangement.

FIG. 6 shows a step-shaped design of the layers of insulating material in which an overlap region has been formed during assembly, so that the strength of the laminate system is enhanced. The overlap need not necessarily be linear or of constant width. Rather than this, it may vary and be adapted particularly to the conductor layers or the discrete components 35.

Figure 7:
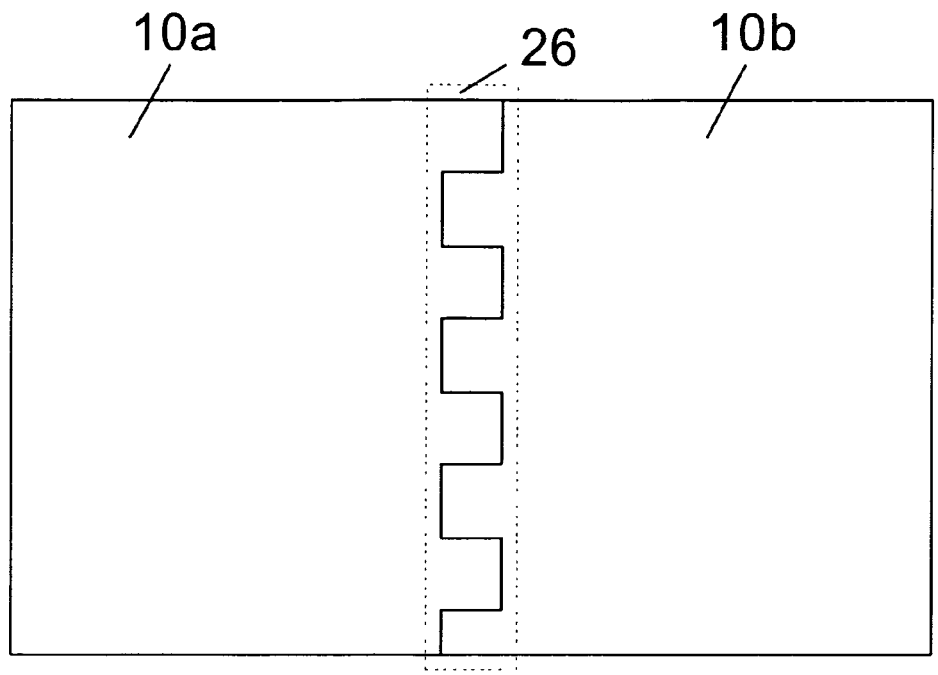
FIG. 7 shows a plan view of an embodiment with an interlocking arrangement.

FIG. 7 shows an arrangement with interlocking of the two layers of insulating material, whereby the mechanical stability may be further increased. Particularly expedient is a combination with the step-shaped design of FIG. 6. Of course, any desired combinations of the embodiments shown here are also possible. In particular, reinforcement members may be disposed inside the layers of insulating material, or also on the upper side or lower side.

Figure 8:
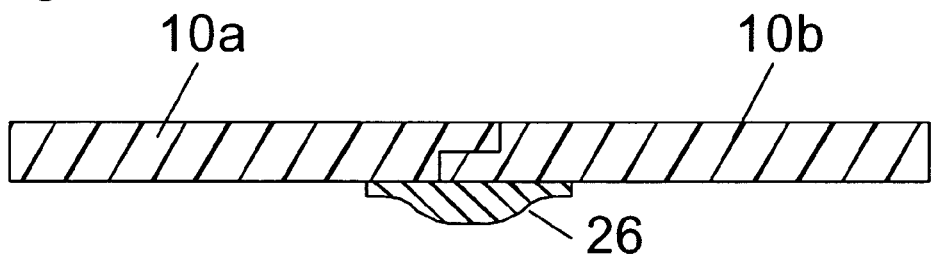
FIG. 8 shows a sectional view of an arrangement having a circular reinforcement member with thickness increasing towards the center.

FIG. 8 shows an arrangement with a circular reinforcement member 26. The thickness of the reinforcement member 26 increases towards the center.

Figure 9:
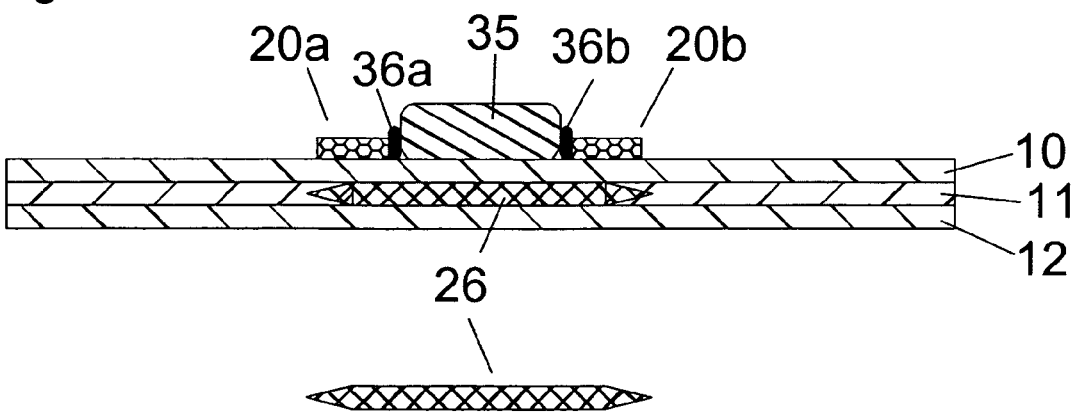
FIG. 9 shows a sectional view of an arrangement with another embodiment of a reinforcement member.

FIG. 9 illustrates a special embodiment of a reinforcement member 26. The remaining parts correspond to FIG. 2. The reinforcement member 26 is embedded in the insulator 11. For better illustration, the reinforcement member 26 has also been shown separately below the arrangement. It is preferably designed to be a round disk that has been flattened or tapered at the edges. The flattening or tapering may extend along both the upper side and the lower side, as shown, but also along one side only.

A coil arrangement in accordance with the invention comprises a multi-layer construction, in which at least two layers are joined together, preferably in the form of a laminate. At least one layer comprises a dielectric insulating material (insulator layer) preferably having as low as possible dielectric losses in the operating frequency range of the coil arrangement. Materials of this kind may comprise, for example, plastics such as PTFE (polytetrafluoroethylene), PE (polyethylene), or also ceramic materials. In order to increase the mechanical stability, fibers such as glass fibers or carbon fibers may be embedded.

A typical operating frequency range of coil arrangements of this kind is in the range of 30 MHz to several 100 MHz according to the prevailing outer magnetic field of the arrangement. Firmly connected to this support material is at least one layer of conducting material (conductor layer), the shape of the coils having been formed in this layer. A connection between the layers, or the layers themselves, may be semi-flexible, so that internal tension cannot be caused, or can be reduced, when the arrangement is subjected to bending. A conducting layer may be applied onto the first layer, optionally by chemical or electrochemical methods, in particular by electroplating or etching, or mechanically. Thus, it may be rolled on, for example in the form of a thin foil.

Coil arrangements of this kind may be also formed by multi-layer technology in order to dispose a plurality of optionally concentric, or at least partly overlapping, coils in different layers.

Coil arrangements of this kind may be mounted not only on the outside of a patient, but also inserted into the inside of the body. For this, they are preferably designed to be flexible, and thus bendable or adapted to be rolled-up.

Furthermore, according to the invention at least one recess for accommodating at least one discrete component is provided in at least one layer of insulating material, and optionally also in at least one layer comprising electrically conducting material.

In another advantageous embodiment of the invention, the discrete components optionally comprise coils, resistors, and also semiconductors such as, for example, diodes. These components are preferably made by SMD technology in order to enable particularly space saving and efficient assembly. Furthermore, components of this kind improve the high-frequency engineering properties, and reduce effects on the magnetic field.

In another embodiment of the invention, reinforcement members are additionally provided to increase further the mechanical stability of the entire arrangement. Particularly critical are the locations on the arrangement at which recesses have been provided, or at which various parts of printed circuit boards, or layers of insulating material, have been joined together. It is here that cracks or breaks predominantly form when mechanical stresses act on the entire arrangement. The reinforcement members are provided additionally in order to avoid these.

It is of advantage for reinforcement members of this kind to be formed in the shape of ribs, cages, or also rings. Rib-shaped arrangements having, for example, a grid structure may be provided.

It is of particular advantage for the reinforcement members to comprise a plastic material. Particularly expedient is the use of fiber-reinforced (glass fiber, carbon fiber, etc.) plastics.

Furthermore, it is of advantage for a plurality of reinforcement members to be joined together to increase the overall stability.

In a special embodiment of the invention, at least one of the reinforcement members is fixed to the surface of the arrangement, preferably with an adhesive.

Furthermore, it is of advantage for at least one of the reinforcement members to be incorporated into the arrangement itself, preferably by pressing or casting.

An advantageous development consists of measures for reducing mechanical stresses, in particular for reducing notch-stresses. These may occur, for example, at drill-holes, countersunk portions and other places.

In another expedient embodiment, at least one reinforcement member is shaped to be elliptical, and preferably circular. This circular shape results in a uniform distribution of force, particularly when bending stresses act on the arrangement.

Furthermore, a reinforcement member of this kind is designed to further improve a distribution of force by having a rigidity which is small at the edge, and increases towards an inner region. This inner region is preferably at the center. Similarly, the reinforcement member may also be designed to be asymmetrical.

This increasing rigidity may be achieved, for example, with a disk having radial slots or beads.

Similarly, it may be achieved also with a material thickness that increases in the direction away from the edge. Alternatively, however, an increase of the density of the material also may be attained. For this, the material thickness could remain approximately constant, which results in simpler processability. Also, other materials, for example a core of one or more materials having a higher rigidity, could be embedded in the reinforcement member. Of course, a plurality of these embodiments could be combined with each other.

The invention claimed is:

1. RF coil arrangement configured for magnetic resonance or nuclear spin tomographs, comprising:
    at least one support layer of insulating material;
    electrical conductors mounted on the at least one support layer of insulating material in order to form one or a plurality of inductive components;
    at least one discrete component selected from the group consisting of capacitors, coils, resistors, and semiconductors mounted on or partially within the at least one support layer of insulating material;
    a solder joint coupled on either side of the discrete component connecting the discrete component to each of two said electrical conductors; and
    at least one reinforcement member increasing mechanical stability of the RF coil arrangement being arranged only in a region locally below the at least one discrete component and its associated solder joint.

2. RF coil arrangement according to claim 1, wherein the at least one support layer of insulating material has a recess for accommodating the at least one discrete component.

3. RF coil arrangement according to claim 1, comprising a laminate produced by pressing or adhesively bonding at least one layer comprising electrically conducting material from which the inductive components or parts thereof are formed, to at least one layer of insulating material.

4. RF coil arrangement according to claim 1, wherein the inductive components or parts thereof are produced by chemical or electrochemical methods in the form of at least one electrically conducting layer on the at least one support layer of insulating material.

5. RF coil arrangement according to claim 1, wherein the RF coil arrangement is designed as a printed circuit board.

6. RF coil arrangement according to claim 1, wherein the at least one reinforcement member is shaped as one of a rib, a cage, a disk, and a ring.

7. RF coil arrangement according to claim 1, wherein the at least one reinforcement member comprises a plastics material.

8. RF coil arrangement according to claim 1, wherein the at least one reinforcement member has a thickness of material progressively increasing from an edge to a center of the reinforcement member.

9. RF coil arrangement according to claim 1, wherein the at least one reinforcement member is shaped as a disk having a circumferential edge portion that is tapered towards the edge along an upper and a lower side of the disk.

10. RF coil arrangement according to claim 1, wherein a plurality of reinforcement members are joined to each other.

11. RF coil arrangement according to claim 1, wherein the at least one reinforcement member is affixed to the surface of the at least one support layer by adhesive bonding.

12. RF coil arrangement according to claim 1, wherein the at least one reinforcement member is incorporated in the at least one support layer.

13. RF coil arrangement according to claim 1, wherein the at least one reinforcement member is incorporated in the support by pressing or casting.

14. RF coil arrangement according to claim 1, wherein the at least one reinforcement member is of elliptical or circular shape.

* * * * *